(12) United States Patent
Liu

(10) Patent No.: US 6,346,474 B1
(45) Date of Patent: Feb. 12, 2002

(54) DUAL DAMASCENE PROCESS

(75) Inventor: Jacson Liu, Hsinchu Hsien (TW)

(73) Assignee: Mosel Viteli Inc., Taiwan (CN)

( * ) Notice: Subject to any disclaimer, the term of this patent is extended or adjusted under 35 U.S.C. 154(b) by 0 days.

(21) Appl. No.: 09/459,609

(22) Filed: Dec. 13, 1999

(30) Foreign Application Priority Data

May 17, 1999 (TW) .......................................... 88107968

(51) Int. Cl.[7] .............................................. H01L 23/58
(52) U.S. Cl. ........................ 438/633; 438/638; 438/643
(58) Field of Search ................................ 438/633, 618, 438/620, 622, 692, 709–710, 637, 638, 643

(56) References Cited

U.S. PATENT DOCUMENTS 6,110,648 A * 8/2000 Jang ........................ 438/618 X
6,114,250 A * 9/2000 Ellingboe et al. ........... 438/709

* cited by examiner

Primary Examiner—Olik Chaudhuri
Assistant Examiner—(Vikki) Hoa B. Trinh
(74) Attorney, Agent, or Firm—Morrison & Foerster LLP

(57) ABSTRACT

A process for creating a dual damascene structure without needing an etch stop is disclosed. The process comprises the steps of: (a) providing a device substrate having a dielectric layer thereon; (b) forming a mask layer with a via pattern overlaying the dielectric layer; (c) forming a photoresist layer with a conductive line pattern aligned with said via pattern overlaying the mask layer; (d) etching part of the way through the dielectric layer using said mask layer as an etch mask, thereby transferring said via pattern into the upper half of the dielectric layer; (e) etching said mask layer and said dielectric layer using said photoresist layer as an etch mask, thereby transferring said conductive line pattern into the upper half of the dielectric layer to form a conductive line trench, and simultaneously transferring said via pattern in the upper half of the dielectric layer into the lower half of the dielectric layer to form a via opening; and (f) filling said conductive line trench and said via opening with a conductive material.

20 Claims, 3 Drawing Sheets

DUAL DAMASCENE PROCESS

BACKGROUND OF THE INVENTION

1. Field of the Invention

The present invention relates in general to the manufacture of semiconductor integrated circuits. More particularly, it relates to a process for creating a dual damascene structure in a dielectric layer without an etch stop.

2. Description of the Related Arts

In very and ultra large scale integration (VLSI and ULSI) circuits, an insulating or dielectric material (such as silicon oxide) of the semiconductor device in a dual damascene process is patterned with several thousand openings for the conductive lines and vias which are filled with metal (such as aluminum) and serve to interconnect the active and/or passive elements of the integrated circuit. The dual damascene process is also used for forming multilevel metal signal lines (such as copper signal lines) in the insulating layers (such as polyimide) of the multilayer substrate on which semiconductor devices are mounted.

Damascene is an interconnection fabrication process in which trenches are formed in a dielectric layer and filled with metal to form the conductive lines. Dual damascene is a multi-level interconnection process in which, in addition to forming the trenches of single damascene, the conductive via openings also are formed. Dual damascene is an improvement over single damascene because it permits the filling of both the conductive trenches and vias with metal at the same time, thereby eliminating process steps. In the standard dual damascene process, two photolithographic processes and two dielectric layers separated by an etch stop layer are employed to achieve the dual damascene structure.

Although the dual damascene offers advantages over other processes for forming interconnections, it has a major drawback in that the etch stop, typically silicon nitride or silicon oxynitride, considerably increases the effective capacitance and the RC delay time due to its high dielectric constant. As a result, the operational speed of the semiconductor device is decreased. Thus, improvements are needed in the dual damascene process to eliminate the use of the etch stop.

SUMMARY OF THE INVENTION

An object of the invention is to provide an improved dual damascene process for forming conductive line trenches and vias without an etch stop, thereby reducing the effective capacitance and increasing the operational speed of semiconductor devices.

To accomplish the above objective, the present invention provides a process for forming a dual damascene metal interconnect and via structure over a substrate. A via pattern is first etched in the upper half of a dielectric layer by using a hard mask overlying the dielectric layer. Then a conductive line pattern is etched in the upper half of the dielectric layer while the via pattern already present in the upper half of the layer is simultaneously transferred into the lower half. Thus, a dual damascene structure comprising via openings and metal line trenches is created in the dielectric layer without needing an etch stop.

According to an aspect of the invention, there is provided a damascene process which includes the steps of: (a) providing a device substrate having a dielectric layer thereon; (b) forming a mask layer with a via pattern overlaying the dielectric layer; (c) forming a photoresist layer with a conductive line pattern aligned with said via pattern overlaying the mask layer; (d) etching part of the way through the dielectric layer using said mask layer as an etch mask, thereby transferring said via pattern into the upper half of the dielectric layer; (e) etching said mask layer and said dielectric layer using said photoresist layer as an etch mask, thereby transferring said conductive line pattern into the upper half of the dielectric layer to form a conductive line trench, and simultaneously transferring said via pattern in the upper half of the dielectric layer into the lower half of the dielectric layer to form a via opening; and (f) filling said conductive line trench and said via opening with a conductive material.

According to another aspect of the invention, there is provided another damascene process which includes the steps of: (a) providing a device substrate having a dielectric layer thereon; (b) forming a mask layer with a via pattern overlaying the dielectric layer; (c) forming a photoresist layer with a conductive line pattern aligned with said via pattern overlaying the mask layer; (d) transferring said conductive line pattern into the upper half of the dielectric layer to form a conductive line trench, and simultaneously transferring said via pattern into the lower half of the dielectric layer to form a via opening by a single selective etching; and (e) filling said conductive line trench and said via opening with a conductive material.

In accordance with the present invention, the mask layer is preferably silicon nitride or silicon oxynitride, and preferably has a thickness of about 100 Å to 1000 Å. The dielectric layer can be silicon dioxide, borosilicate glass, borophosphosilicate glass, phosphosilicate glass, or low-k materials.

Other objects, features, and advantages of the present invention will become apparent from the following detailed description which makes reference to the accompanying drawings.

DESCRIPTION OF THE PREFERRED EMBODIMENTS

Figure 1:
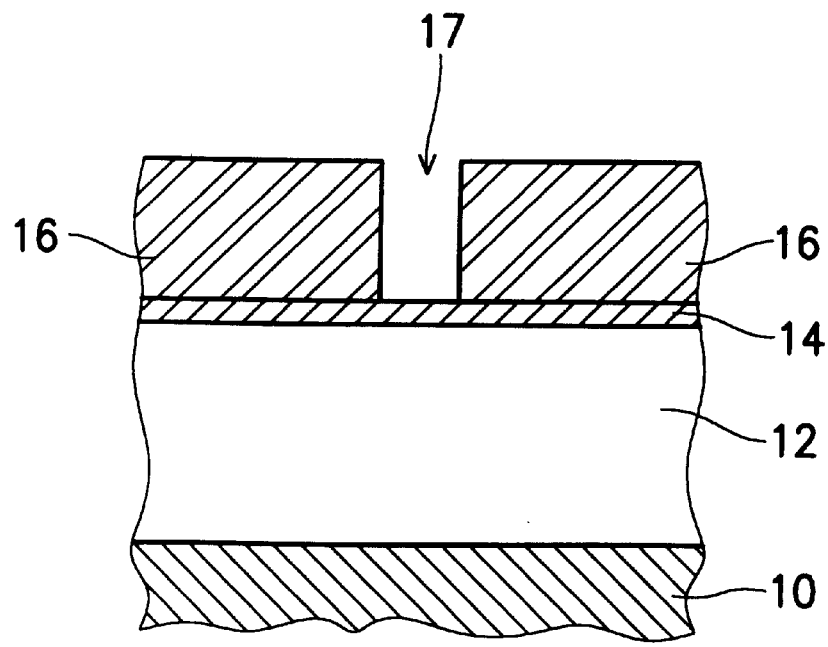
FIGS. 1 to 5 are cross sectional views illustrating the respective steps of a dual damascene process according to a preferred embodiment of the present invention.

FIGS. 1–5 illustrate, in cross-section, process steps for the fabrication of a dual damascene structure in accordance with one embodiment of the invention. FIG. 1 shows a portion of a semiconductor device which includes a device substrate 10 and an overlying inter-metal dielectric (IMD) layer 12 where the dual damascene structure is to be formed. Although not shown in FIGS. 1–5, those skilled in the art will appreciate that device substrate 10 will typically contain a large number of electrically coupled device components. The electrically coupled device components can include MOS transistors, resistors, logic devices, and the like. In addition, substrate 10 can include metal interconnect layers overlying other device components and electrically coupled to those device components. The IMD layer 12 may consist of one or more commonly used dielectric materials in semiconductor processing. For example, the IMD layer 12 can be selected from the group consisting of silicon dioxide, borosilicate glass (BSG), borophosphosilicate glass (BPSG), phosphosilicate glass (PSG), and low-k materials such as fluorosilicate glass (FSG), hydrogen silsesquioxane (HSQ), FLARE from Allied Signal, and PAE-2 from Schumacher. It should be particularly noted that since an etch stop is not required in the current approach, the IMD layer 12 can preferably be a single-layer dielectric even though it may contain more than one dielectric material. As a specific example, the dielectric layer 12 herein is plasma enhanced chemical vapor deposited (PECVD) silicon oxide.

The dielectric layer 12 is provided with a mask layer 14 which allows a selective etch with respect to the underlying dielectric material. Preferably, the mask layer is either silicon nitride (SiN) or silicon oxynitride (SiON) and has a thickness of about 100 Å to 1000 Å. More preferably, the mask layer is formed by plasma enhanced chemical vapor deposition (PECVD) at a temperature between 250° C. and 400° C. For example, PECVD SiN can be formed with reactant gases of $SiH_4/NH_3$, and PECVD SiON can be formed with reactant gases of $SiH_4/N_2O/N_2$, or $SiH_4/NH_3/O_2$.

Figure 2:
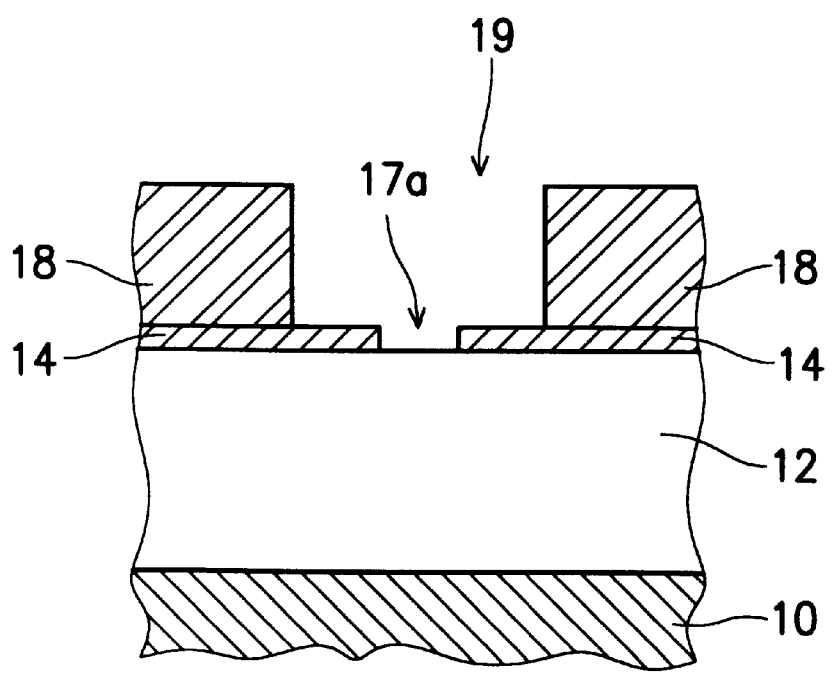

Next, a photoresist layer 16 with a via pattern 17 is formed over the mask layer 14. The via pattern 17 in the photoresist layer is transferred into the mask layer 14 by an anisotropic etching process to form a via pattern opening 17a, as shown in FIG. 2 After removal of the photoresist layer 16, a photoresist layer 18 containing a conductive line pattern 19 aligned with the via pattern opening 17a is formed. Note that the conductive line pattern 19 is wider than the via pattern opening 17a.

Figure 3:
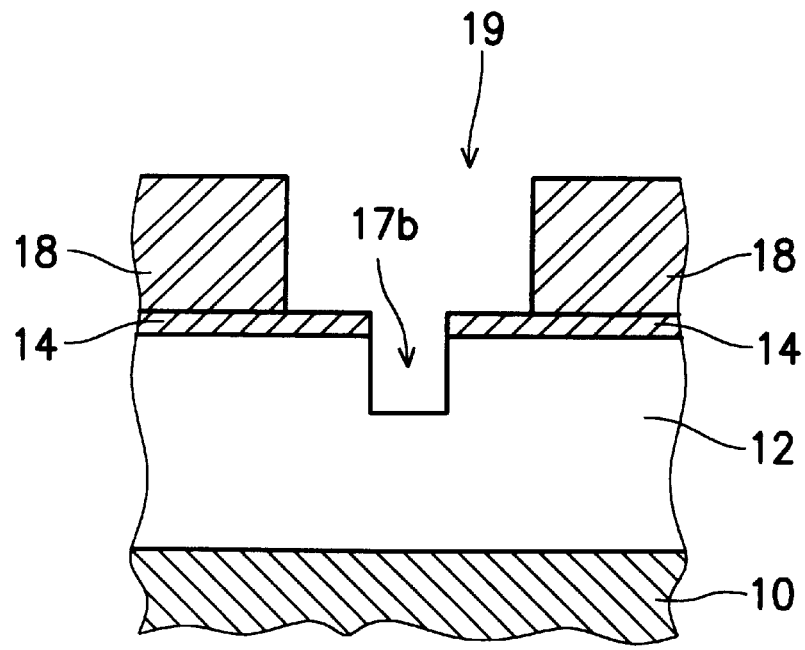
Figure 4:
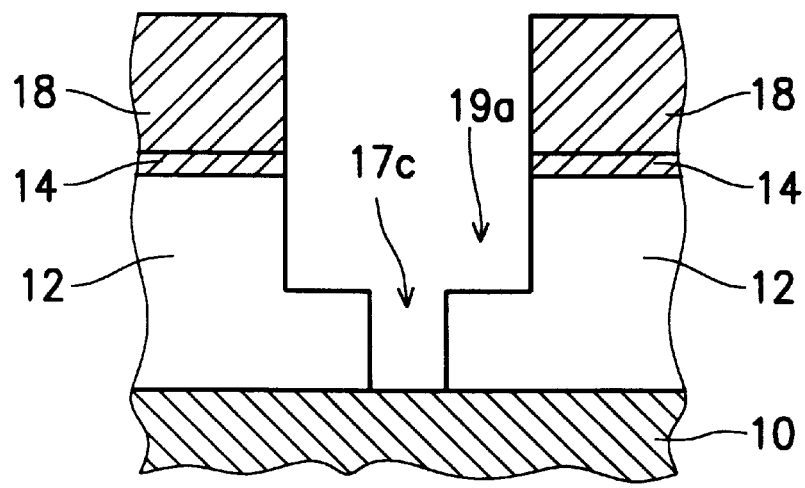

In one embodiment of the invention, the via pattern in the mask layer 14 and the conductive line pattern in the photoresist layer 18 are transferred into the dielectric layer 12 by two selective etchings. First, using the mask layer 14 as an etch mask, the via pattern is anisotropically etched in the upper half of the dielectric layer to form the via opening 17b as shown in FIG. 3. This can be accomplished by a reactive ion etching (RIE) procedure using an etch recipe with an high selectivity to $SiO_2$ or SiON. For example, an recipe comprising $C_4F_8/CO$ can be used, which gives an etch selectivity of about 50/1 for $SiO_2/SiN$. Second, using the photoresist layer 18 as an etch mask, the conductive line pattern 19, which is wider than the via opening 17b, is anisotropically etched in the upper half of the dielectric layer to form conductive line trench 19a, as shown in FIG. 4. Simultaneously with this etching, the via opening 17b is replicated in the lower half of the dielectric layer 12 to form via opening 17c. At the beginning of this etching, an etch recipe with a high selectivity to $SiO_2$ is employed to remove the exposed portions of the mask layer 14. For example, an etch recipe comprising $CHF_3/CO$ or $CH_3F/CO$ can be used. Thereafter, the recipe is changed to an oxide etch recipe for etching the dielectric layer. In accordance with this embodiment, the dielectric layer $(SiO_2)$ 12 preferably has a thickness between 2000 Å and 5000 Å, and the mask layer (SiN or SiON) 14 preferably has a thickness in the range of 200 Å to 1000 Å.

In another embodiment of the invention, the via pattern in the mask layer 14 and the conductive line pattern in the photoresist layer 18 are transferred into the dielectric layer 12 by a single selective etching. This is accomplished by a RIE procedure using an etch recipe with a moderate recipe to SiN or SiON. For example, an recipe comprising $CF_4$ can be used, which gives an etch selectivity of about 2 to 4 for $SiO_2/SiN$. During this etching, the portions of the dielectric layer covered by the mask layer have a lower etching rate with respect to the uncovered portions under the same etchant. This gradually creates a step height between the etching profile along the via pattern opening 17a and the etching profile along the conductive line pattern 19, and finally results in the dual damascene structure.

Figure 5:
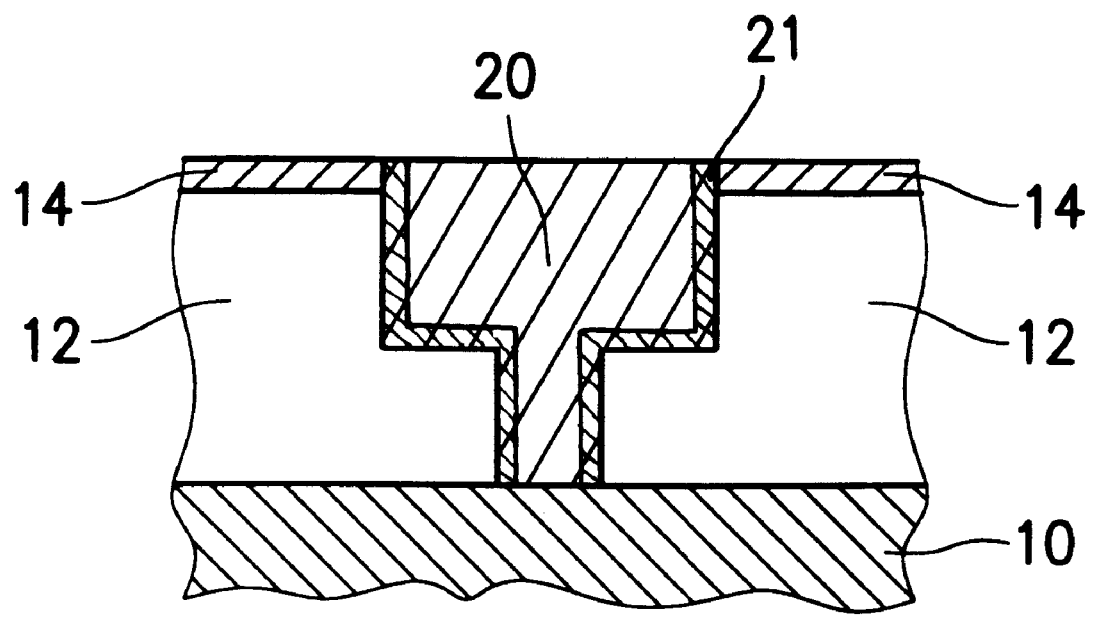

After removal of the photoresist layer 18, the conductive line trench 19a and the via opening 17c are filled, as shown in FIG. 5, with a conductive material 20 by chemical vapor deposition, physical vapor deposition, or electroplating. The conductive material can be Cu, Au, Al, Ag, or their alloys. Before depositing the conductive material, a diffusion barrier layer 21 such as TiN, Ta, TaN, or WN may be deposited over the bottoms and sidewalls of the dual damascene structure so as to improve the adhesion of the conductive material and to prevent it from diffusion. As a final step, the resulting surface is planarized using the well-known chemical-mechanical polishing (CMP) process.

Although this invention has been described relative to specific dielectric materials and specific etch recipes to these material, it is not limited to such materials and etch recipes. Other dielectric materials and etch recipes can be substituted as is well understood by those skilled in the art after appreciating the present invention. Further, while the invention has been particularly shown and described with the reference to the preferred embodiment thereof, it will be understood by those skilled in the art that various changes in form and details may be made without departing from the spirit and scope of the invention.

What is claimed is:

1. A process for forming a dual damascene metal interconnect and via structure over a substrate without an etch stop layer, said process comprising:
   (a) providing a device substrate having a dielectric layer thereon;
   (b) forming a mask layer with a via pattern overlaying the dielectric layer;
   (c) forming a photoresist layer with a conductive line pattern aligned with said via pattern overlaying the mask layer, said photoresist layer being formed directly on the mask layer;
   (d) etching part of the way through the dielectric layer using said mask layer as an etch mask, thereby transferring said via pattern into the upper half of the dielectric layer;
   (e) etching said mask layer and said dielectric layer using said photoresist layer as an etch mask, thereby transferring said conductive line pattern into the upper half of the dielectric layer to form a conductive line trench, and simultaneously transferring said via pattern in the upper half of the dielectric layer into the lower half of the dielectric layer to form a via opening; and
   (f) filling said conductive line trench and said via opening with a conductive material.

2. The process as claimed in claim 1, wherein said dielectric layer is selected from the group consisting of silicon dioxide, borosilicate glass, borophosphosilicate glass, phosphosilicate glass, and low-k materials.

3. The process as claimed in claim 1, wherein said dielectric layer is silicon dioxide.

4. The process as claimed in claim 1, wherein said mask layer is silicon nitride or silicon oxynitride.

5. The process as claimed in claim 1, wherein said mask layer has a thickness of about 100 to 1000 Å.

6. The process as claimed in claim 1, wherein said dielectric layer is silicon dioxide and said mask layer is silicon nitride.

7. The process as claimed in claim 1, wherein said step (e) further comprises depositing a diffusion barrier layer over said conductive line trench and said via opening.

8. The process as claimed in claim 7, wherein said diffusion barrier layer is selected from the group consisting of Ta, TaN, WN, and TiN.

9. The process as claimed in claim 8, wherein said conductive material is selected from the group consisting of Cu, Au, Al, Ag, and their alloys.

10. A process for forming a dual damascene metal interconnect and via structure over a substrate without an etch stop layer, said process comprising:

(a) providing a device substrate having a dielectric layer thereon;

(b) forming a mask layer with a via pattern overlaying the dielectric layer;

(c) forming a photoresist layer with a conductive line pattern aligned with said via pattern overlaying the mask layer, said photoresist layer being formed directly on the mask layer;

(d) transferring said conductive line pattern into the upper half of the dielectric layer to form a conductive line trench, and simultaneously transferring said via pattern into the lower half of the dielectric layer to form a via opening by a single etching; and (f) filling said conductive line trench and said via opening with a conductive material.

11. The process as claimed in claim 10, wherein said dielectric layer is selected from the group consisting of silicon dioxide, borosilicate glass, borophosphosillcate glass, phosphosilicate glass, and low-k materials.

12. The process as claimed in claim 10, wherein said dielectric layer is silicon dioxide.

13. The process as claimed in claim 10, wherein said mask layer is either silicon nitride or silicon oxynitride.

14. The process as claimed in claim 10, wherein said mask layer has a thickness of about 100 to 1000 Å.

15. The process as claimed in claim 10, wherein said dielectric layer is silicon dioxide and said mask layer is silicon nitride.

16. The process as claimed in claim 10, wherein said step (d) further comprises depositing a diffusion barrier layer over said conductive line trench and said via opening.

17. The process as claimed in claim 16, wherein said diffusion barrier layer is selected from the group consisting of Ta, TaN, WN, and TiN.

18. The process as claimed in claim 17, wherein said conductive material is selected from the group consisting of Cu, Au, Al, Ag, and their alloys.

19. The process as claimed in claim 10, wherein said etching has an etch selectivity of about 2 to 4 for $SiO_2$ to SiN.

20. The process as claimed in claim 19, wherein said etching is carried out by a RIE procedure using $CF_4$ as an etchant.

* * * * *